United States Patent
Lin et al.

(10) Patent No.: US 9,536,792 B2
(45) Date of Patent: Jan. 3, 2017

(54) COMPLEMENTARY METAL OXIDE SEMICONDUCTOR FIELD EFFECT TRANSISTOR, METAL OXIDE SEMICONDUCTOR FIELD EFFECT TRANSISTOR AND MANUFACTURING METHOD THEREOF

(71) Applicant: UNITED MICROELECTRONICS CORP., Hsin-Chu (TW)

(72) Inventors: Chien-Ting Lin, Hsinchu (TW); Shih-Hung Tsai, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 13/738,934

(22) Filed: Jan. 10, 2013

(65) Prior Publication Data
US 2014/0191318 A1    Jul. 10, 2014

(51) Int. Cl.
| | | |
|---|---|---|
| *H01L 29/66* | (2006.01) | |
| *H01L 29/78* | (2006.01) | |
| *H01L 21/8238* | (2006.01) | |
| *H01L 21/84* | (2006.01) | |
| *H01L 27/092* | (2006.01) | |
| *H01L 27/12* | (2006.01) | |

(52) U.S. Cl.
CPC ..... *H01L 21/823821* (2013.01); *H01L 21/845* (2013.01); *H01L 27/0924* (2013.01); *H01L 27/1211* (2013.01)

(58) Field of Classification Search
CPC ............ H01L 29/41791; H01L 29/66772; H01L 29/66795; H01L 29/7831; H01L 29/785; H01L 29/786; H01L 2029/785; H01L 2029/7858; H01L 2029/786; H01L 27/0886; H01L 27/0924; H01L 27/10826; H01L 27/10897; H01L 27/1221; H01L 29/7833; H01L 29/6659; H01L 29/66598
USPC .......................... 257/60, 135, 136, 263–267, 302,257/328–334, 347, E21.19, E21.09, E21.676,257/E21.693, E27.06, 344; 438/134, 154
See application file for complete search history.

(56) References Cited

U.S. PATENT DOCUMENTS

| | | | |
|---|---|---|---|
| 6,043,138 | A | 3/2000 | Ibok |
| 6,492,216 | B1 | 12/2002 | Yeo |
| 6,921,963 | B2 | 7/2005 | Krivokapic |
| 7,087,477 | B2 | 8/2006 | Fried |

(Continued)

FOREIGN PATENT DOCUMENTS

| | | |
|---|---|---|
| TW | 200843109 | 11/2008 |
| TW | 201133793 A1 | 10/2011 |

*Primary Examiner* — Moazzam Hossain
(74) *Attorney, Agent, or Firm* — Winston Hsu; Scott Margo

(57) ABSTRACT

A complementary metal oxide semiconductor field-effect transistor (MOSFET) includes a substrate, a first MOSFET and a second MOSFET. The first MOSFET is disposed on the substrate within a first transistor region and the second MOSFET is disposed on the substrate within a second transistor region. The first MOSFET includes a first fin structure, two first lightly-doped regions, two first doped regions and a first gate structure. The first fin structure includes a first body portion and two first epitaxial portions, wherein each of the first epitaxial portions is disposed on each side of the first body portion. A first vertical interface is between the first body portion and each of the first epitaxial portions so that the first-lightly doped region is able to be uniformly distributed on an entire surface of each first vertical interface.

16 Claims, 5 Drawing Sheets

(56) References Cited

U.S. PATENT DOCUMENTS

| | | |
|---|---|---|
| 7,091,551 B1 | 8/2006 | Anderson |
| 7,247,887 B2 | 7/2007 | King |
| 7,250,658 B2 | 7/2007 | Doris |
| 7,309,626 B2 | 12/2007 | Ieong |
| 7,352,034 B2 | 4/2008 | Booth, Jr. |
| 7,470,570 B2 | 12/2008 | Beintner |
| 7,531,437 B2 | 5/2009 | Brask |
| 7,569,857 B2 | 8/2009 | Simon |
| 7,667,271 B2 * | 2/2010 | Yu ................. H01L 21/26586 257/347 |
| 2004/0195624 A1 | 10/2004 | Liu |
| 2005/0051825 A1 | 3/2005 | Fujiwara |
| 2005/0090096 A1 * | 4/2005 | Hou .................... H01L 21/743 438/637 |
| 2006/0099830 A1 | 5/2006 | Walther |
| 2006/0202266 A1 * | 9/2006 | Radosavljevic et al. ..... 257/344 |
| 2006/0286729 A1 | 12/2006 | Kavalieros |
| 2007/0108528 A1 | 5/2007 | Anderson |
| 2007/0158756 A1 | 7/2007 | Dreeskornfeld |
| 2008/0157208 A1 | 7/2008 | Fischer |
| 2009/0124097 A1 | 5/2009 | Cheng |
| 2009/0242964 A1 | 10/2009 | Akil |
| 2009/0269916 A1 | 10/2009 | Kang |
| 2010/0048027 A1 | 2/2010 | Cheng |
| 2010/0072553 A1 | 3/2010 | Xu |
| 2010/0144121 A1 | 6/2010 | Chang |
| 2010/0167506 A1 | 7/2010 | Lin |
| 2011/0068407 A1 * | 3/2011 | Yeh et al. ..................... 257/369 |
| 2011/0223736 A1 | 9/2011 | Lin |
| 2011/0278676 A1 * | 11/2011 | Cheng ............ H01L 21/823807 257/369 |
| 2012/0086109 A1 * | 4/2012 | Kim ..................... H01L 21/561 257/659 |
| 2012/0091528 A1 * | 4/2012 | Chang ................ H01L 29/7848 257/347 |
| 2012/0146101 A1 * | 6/2012 | Lin .............. 257/255 |
| 2012/0196410 A1 * | 8/2012 | Tsai ................ H01L 29/66795 438/151 |
| 2013/0187235 A1 * | 7/2013 | Huang ........... H01L 21/823821 257/369 |
| 2013/0249003 A1 * | 9/2013 | Oh ........ H01L 21/845 257/347 |
| 2013/0257564 A1 * | 10/2013 | Huang ............. H01L 23/49827 333/177 |
| 2013/0264676 A1 * | 10/2013 | Yang .................. H01L 23/5226 257/508 |
| 2013/0295738 A1 * | 11/2013 | Kuo et al. ..................... 438/283 |
| 2014/0027860 A1 * | 1/2014 | Glass et al. .................. 257/401 |
| 2014/0042500 A1 * | 2/2014 | Wann et al. .................. 257/288 |

\* cited by examiner

COMPLEMENTARY METAL OXIDE SEMICONDUCTOR FIELD EFFECT TRANSISTOR, METAL OXIDE SEMICONDUCTOR FIELD EFFECT TRANSISTOR AND MANUFACTURING METHOD THEREOF

BACKGROUND OF THE INVENTION

1. Field of the Invention

The present invention generally relates to a structure of a complementary metal oxide semiconductor field effect transistor, and more particularly, to a structure of a multi-gate metal oxide semiconductor field effect transistor (multi-gate MOSFET) and a manufacturing method thereof.

2. Description of the Prior Art

The dominant semiconductor technology used for the manufacture of ultra-large scale integrated (ULSI) circuits is the metal-oxide-semiconductor field effect transistor (MOSFET) technology. Reduction in the size of MOSFETs has provided continued improvement in speed, performance, circuit density and cost per unit function over the past few decades. As the gate length of the conventional bulk MOSFET is reduced, the source and drain increasingly interact with the channel and gain influence on the channel potential. Consequently, a transistor with a short gate length suffers from problems related to the inability of the gate to substantially control the on and off states of the channel. Phenomena such as reduced gate control associated with transistors with short channel lengths are termed short-channel effects.

Increased body doping concentration, reduced gate oxide thickness, and ultra-shallow source/drain junctions are ways to suppress short-channel effects. However, for device scaling well into the sub-30 nm regime, approaches involving the use of multi-gate field-effect transistors (multi-gate FETs) are being investigated to improve the short channel effects. Generally, multi-gate FETs comprise raised source/drain regions having one or more raised channel regions, and a gate dielectric and a gate electrode are formed over the fin. It has been found that multi-gate FETs provide for improved scalability as design requirements shrink and better short-channel control.

It is difficult, however, to achieve a uniform three-dimensional implantation of the lightly doped drain (LDD), doped halo regions and source/drain regions. For example, according to a method disclosed in a prior art for fabricating tri-gate devices, even though two ion implantation processes with different tilt angles are carried out for forming a LDD region and/or a halo region at each end and/or at the bottom of the fin, the conformality of the LDD regions is still not good enough to meet the requirements in high-end products. Furthermore, corresponding external resistance ($R_{ext}$) of the fin needs to be reduced as the size of the devices continuously shrinks. As a result, an improved multi-gate FET structure and method of fabricating a multi-gate FET are needed.

SUMMARY OF THE INVENTION

To this end, one objective of the present invention is to provide a CMOS structure, a MOSFET structure and a manufacturing method thereof in order to solve the drawbacks in current techniques.

According to one embodiment of the present invention, a complementary metal oxide semiconductor field-effect transistor (MOSFET) is provided. The complementary MOSFET includes a substrate, a first MOSFET and a second MOSFET. The first MOSFET is disposed on the substrate within a first transistor region and the second MOSFET is disposed on the substrate within a second transistor region. The first MOSFET includes a first fin structure, two first lightly-doped regions, two first doped regions and a first gate structure. The first fin structure includes a first body portion and two first epitaxial portions, wherein each of the first epitaxial portions is disposed on each side of the first body portion. A first vertical interface is between the first body portion and each of the first epitaxial portions so that the first-lightly doped region is able to be uniformly distributed on an entire surface of each first vertical interface.

According to another embodiment of the present invention, a metal oxide semiconductor field-effect transistor (MOSFET) is provided. The MOSFET includes a substrate, a fin structure, two lightly-doped regions, two doped regions and a gate structure. The fin structure is disposed on the substrate and includes a body portion and two epitaxial portions. A vertical interface is between the body portion and each of the epitaxial portions so that the first-lightly doped region is able to be uniformly distributed on an entire surface of each vertical interface.

According to still another embodiment of the present invention, a method for manufacturing MOSFET including the following steps is provided. First, a fin semiconductor layer is formed on a substrate. A gate electrode is then formed to overlay a portion of the fin semiconductor layer. In a next step, a gate spacer is formed on sidewalls of the gate electrode, wherein a portion of the fin semiconductor layer is exposed from the gate spacer. The fin semiconductor layer exposed from the gate spacer is then removed so that a vertical interface is exposed from at least one side of the fin semiconductor layer. At least an epitaxial layer is formed on the vertical interface, wherein a lightly-doped region is uniformly formed on the entire vertical interface concurrently during a step for forming the epitaxial layer. Finally, a doped region is formed in the epitaxial layer.

These and other objectives of the present invention will no doubt become obvious to those of ordinary skill in the art after reading the following detailed description of the preferred embodiment that is illustrated in the various figures and drawings.

DETAILED DESCRIPTION

The making and using of the presently preferred illustrative embodiments are discussed in detail below. It should be appreciated, however, that the present invention provides many applicable inventive concepts that can be embodied in a wide variety of specific contexts. The specific illustrative embodiments discussed are merely illustrative ways to make and use the invention, and do not limit the scope of the invention.

Figure 1:
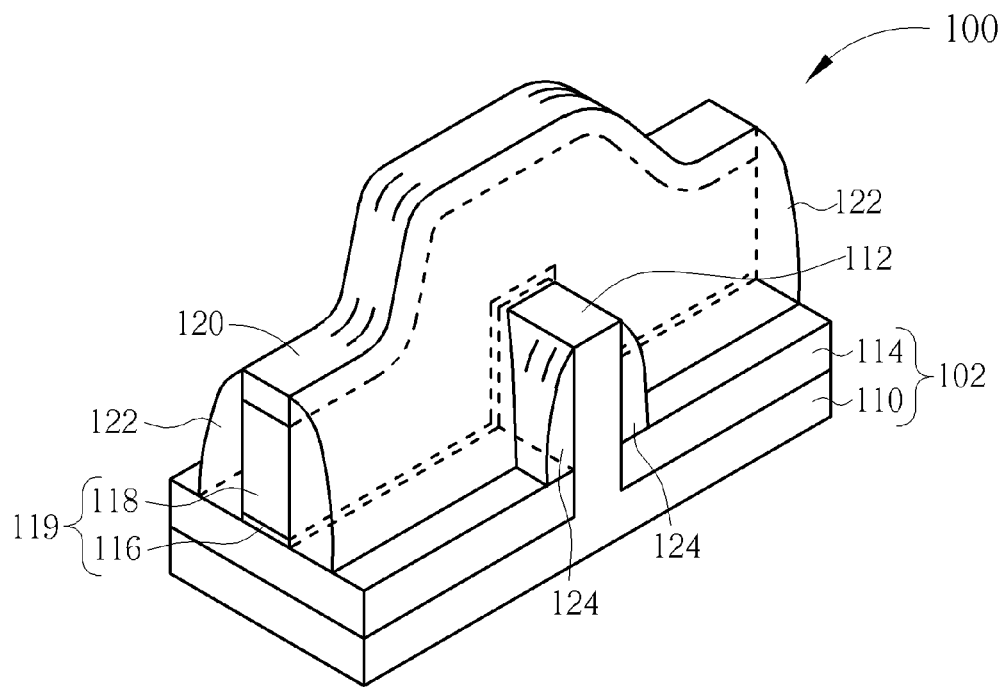
FIGS. 1-10 are illustrative diagrams showing a method for manufacturing field effect transistors according to various embodiments of the present invention.

FIG. 1 is a schematic diagram showing a method for manufacturing a MOSFET according to a first embodiment of the present invention. As shown in FIG. 1, a Semiconductor structure 100 is provided and can be used as a beginning or an intermediate structure for manufacturing a multi-gate field effect transistor according to the present embodiment. At this stage, the semiconductor structure 100 may include a semiconductor substrate 110, a fin semiconductor layer 112, an isolation layer 114, a gate dielectric layer 116, a gate electrode 118, a first mask 120, a first spacer 122 and a second spacer 124. It should be noted that the structure shown in FIG. 1 is for illustrative purposes only and the drawings showing the embodiment of the apparatus are not to scale and some dimensions are exaggerated for clarity of presentation. According to a first embodiment of the present invention, the semiconductor substrate 110 and the isolation layer 114 comprise a substrate 102 and the fin semiconductor layer 112 may be regarded as an extruding portion of the semiconductor substrate 110. To put it more concretely, the semiconductor substrate 110 extrudes from the isolation layer 114 and has a stripe layout. According to another embodiment, the substrate 102 may be a silicon-on-insulator (SOI) substrate or other suitable substrate so that there is an isolation layer between the fin semiconductor layer and the semiconductor substrate. Generally, the semiconductor substrate 110 may include dopants with certain conductivity or concentration. Additionally, the semiconductor substrate 110 may be covered by other semiconductor layers, such as a silicon germanium layer or a silicon phosphorous layer.

Preferably, the fin semiconductor layer 112 may be patterned to have a stripe shape as illustrated in FIG. 1 and three surfaces of a portion of the fin semiconductor layer 112 are covered by the gate electrode 118. The gate electrode 118 is covered by a first mask 120 and the shape of the first mask 120 can be transferred to the gate electrode 118 through a proper etch process. Preferably, a gate dielectric layer 116 is interposed between the gate electrode 118 and the fin semiconductor layer 112. The gate dielectric layer 116 may be fabricated through an oxidation process, such as thermal oxidation process, or a deposition process, such as a chemical vapor deposition (CVD) process, but is not limited thereto. The gate electrode 118 and the gate dielectric layer 116 may comprise a gate structure 119 so that it can be functioned to control on/off states of carrier channels in a MOSFET device. To put it more concretely, various semiconductor processes for manufacturing MOS with polysilicon gate or MOS with metal gate may be integrated as processes for manufacturing the semiconductor structure 100. For example, the manufacturing processes may include gate-first processes or gate-last processes. The composition of the gate electrode 118 may comprise a semiconductor material such as polysilicon, amorphous silicon, or the like. The gate electrode layer 118 may be deposited doped or undoped. For example, in an embodiment the gate electrode layer 118 comprises polysilicon deposited undoped by low-pressure chemical vapor deposition (LPCVD). Once applied, the polysilicon may be doped with, for example, phosphorous ions (or other P-type dopants) to form a PMOS device or boron (or other N-type dopants) to form an NMOS device. Alternatively, the gate electrode layer 118 may comprise a polysilicon metal alloy or a metal gate comprising metals such as tungsten, copper, nickel, and titanium, for example. The composition of the gate dielectric layer 116 may include dielectric material, such silicon oxide, or include high-K dielectric material. The high-K dielectric material includes hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta_2O_9$, SBT), lead zirconate titanate ($PbZrxTi_{1-x}O_3$, PZT), barium strontium titanate ($Ba_xSr_{1-x}TiO_3$, BST) or any combination thereof.

The first spacer 122 and the second spacer 124 may be respectively regarded as a gate spacer and a spacer of the fin semiconductor layer. In other words, the first spacer 122 mainly covers the sidewalls of the gate structure 119 and the second spacer 124 mainly covers the sidewalls of the fin semiconductor layer 112. The first spacer 122 and the second spacer 124 may be formed concurrently or formed at different time. For example, if the first spacer 122 and the second spacer 124 are formed concurrently, a common deposition process and a common etch process may be applied so that dielectric material can be respectively formed on the sidewalls of the gate structure 119 and the fin semiconductor layer 112 in order to form the first spacer 122 and the second spacer 124, but is not limited thereto. It should be noted that each of the first spacer 122 and the second spacer 124 is not limited to a single-layer structure, and it may be multi-layer structure if required.

Figure 2:
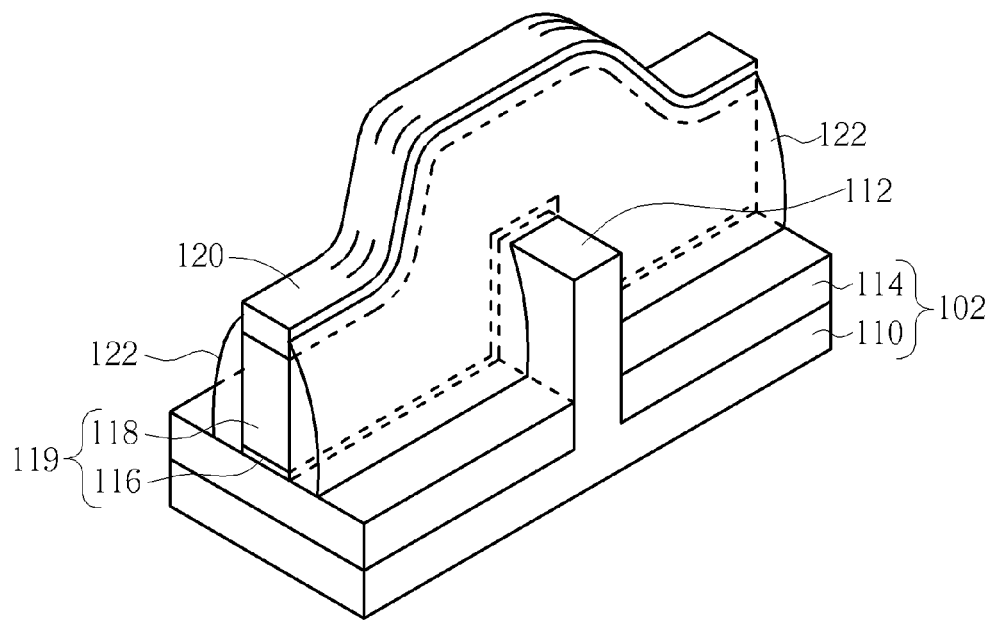

After the structure shown in FIG. 1 is fabricated, next, please refer to FIG. 2. FIG. 2 is a schematic diagram showing a structure of a MOSFET according to the first embodiment of the present invention. In FIG. 2, the second spacer 124 (also-called fin semiconductor spacer) may be removed completely so that a portion of the fin semiconductor layer 112 can be completely exposed from the first spacer 122 (also-called gate spacer). It is worth nothing that the second spacer 124 can be removed through a dry etch process or a wet etch process. Additionally, since the composition of the first spacer 122 and the second spacer 124 is the same according to the present embodiment, a portion of the first spacer 122 may be accordingly removed and a portion of the first mask 120 may be exposed. In other words, by adopting suitable etch parameter and adjusting the thickness of each of the deposited films, only a portion of the sidewalls of the first mask 120 instead of the gate electrode 118 is exposed after the etch process used to remove the second spacer 124 is completed. According to other embodiments, however, if the composition of the first spacer 122 and the second spacer 124 is different from each other, or an etch mask layer (not shown) is formed to cover the first spacer 122 during the process for removing the second spacer 124, only the second spacer 124 may be removed and the first spacer 122 can keep its topography.

Figure 3:
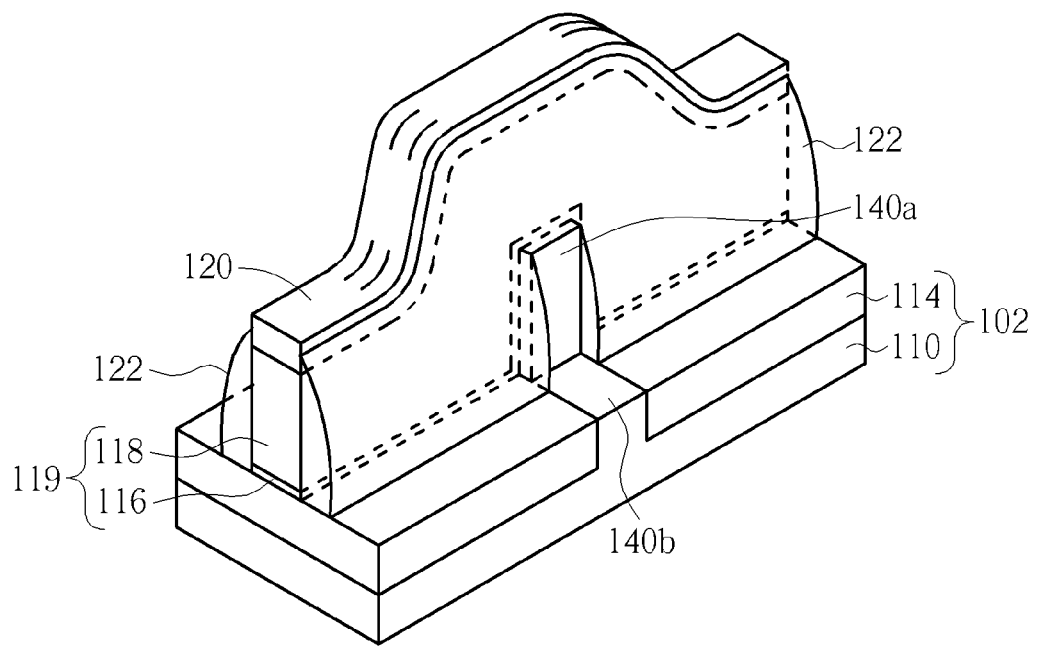

After the second spacer 124 is removed, next, please refer to FIG. 3. At least an etch process, such as an anisotropic etch process, is carried out by using the first mask 120 and the first spacer 122 as etching masks so that the fin semiconductor layer 112 outside of the first spacer can be removed completely. In this way, a vertical interface 140a is formed on at least a side of the fin semiconductor layer 112. Preferably, the vertical interface 140a is a vertical plane parallel to an extending direction of the gate electrode 118 so that the vertical plane may be aligned with the edge of a portion of the first spacer 122. Additionally, since the fin semiconductor layer 112 outside of the first spacer 122 is removed completely after the above-mentioned etch process, a semiconductor interface 140b on the semiconductor substrate 110 may be exposed. Preferably, there is a right angle between the vertical interface 140a and the semiconductor interface 140b, but not limited thereto. The etch process may be a plasma etch process and etch gases include HBr/O2, SF6/CL2, but not limited thereto.

According to the embodiment described above, the semiconductor interface 140b is substantially parallel with the surface of the isolation layer 114 after the etch process is completed. However, according to the structure shown in FIG. 4, the semiconductor interface 140b may be slightly lower than the surface of the isolation layer 114 in order to meet certain requirements. For example, during or after the process for removing the fin semiconductor layer 112 outside the first spacer 122, the same or different etching gases may be applied to further remove the semiconductor substrate 220 exposed from the isolation layer 114 so that the surface of the semiconductor interface 140b may be slightly lower than the surface of the isolation 114. Additionally, the fin semiconductor layer 112 outside the first spacer 122 may be optionally not removed completely after the above-mentioned etch process so that a portion of the fin semiconductor layer may still remain on the semiconductor interface 140b.

Figure 5:
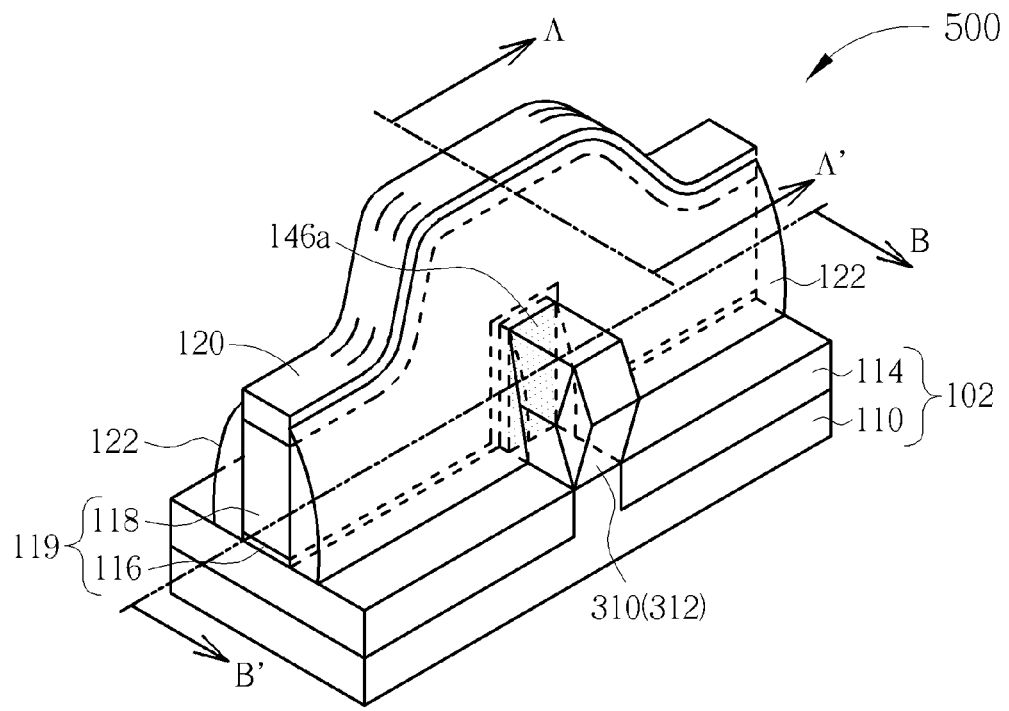
Figure 6:
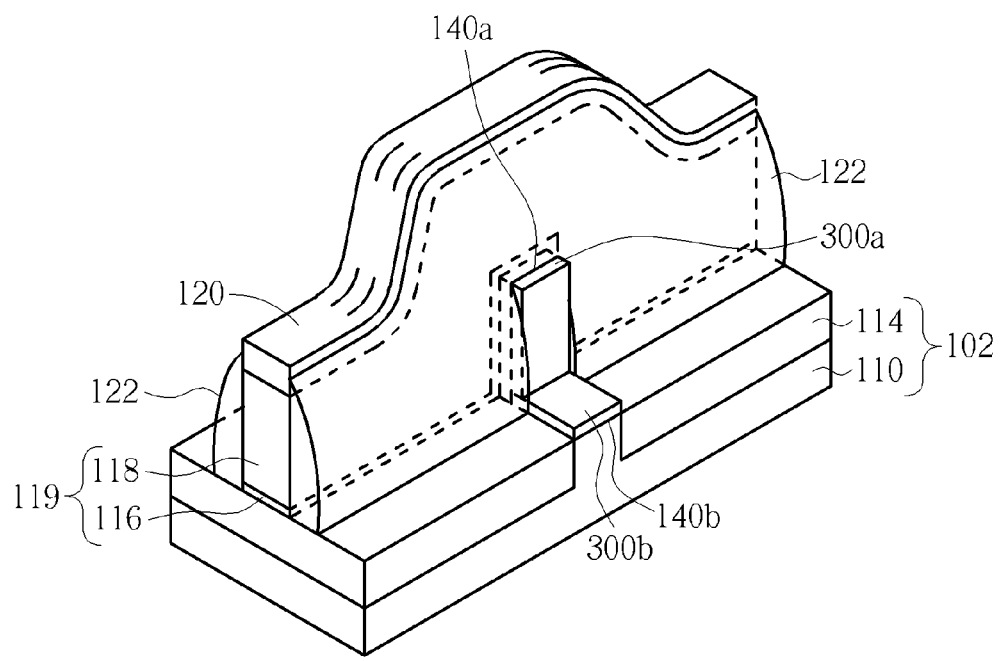
Figure 7:
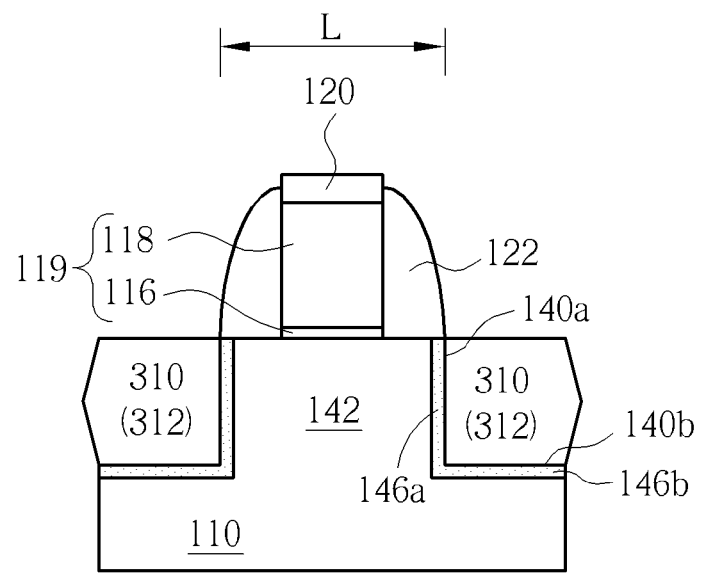
Figure 8:
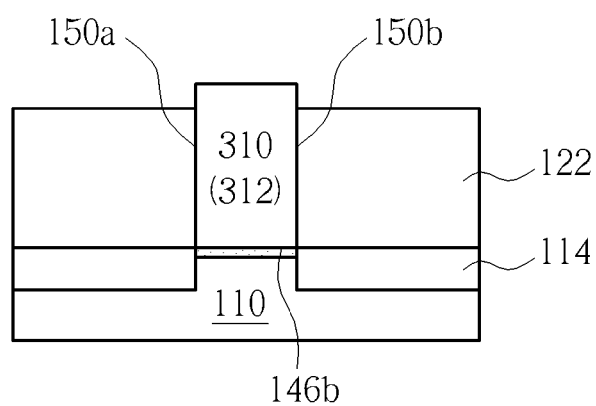

Next, referring to FIG. 5, at least an epitaxial growth process is carried to form an epitaxial layer 310 on each side of the fin semiconductor layer 112. To put it more concretely, at least an epitaxial layer 310 is formed on each of the vertical interface 140a and on the semiconductor interface 140b in a MOSFET 500 shown in FIG. 5. In this way, the epitaxial layer 310 can be used to accommodate a source/drain region of the MOSFET 500. It should be noted that, the epitaxial growth process is preferably an in-situ growth process according to this embodiment. For example, for a PMOS structure, dopants with certain conductivity, such as boron, may be applied during a process for forming epitaxial silicon germanium so that the epitaxial layer 310 may have a required conductivity, such as P-type, and lightly-doped source/drain (not shown) may be formed directly. On the contrary, for a NMOS structure, dopants with certain conductivity, such as arsenic or phosphorous, may be applied during a process for forming epitaxial silicon or silicon carbon so that the epitaxial layer 310 may have a required conductivity, such as N-type, and lightly-doped source/drain (not shown) may be formed directly. Furthermore, a doping process may be carried out after the epitaxial layers 310 are formed so that a doped region 312 may be formed in each of the epitaxial layers 310 (also-called source/drain doped regions). Preferably, the doping concentration of the doped regions 312 is higher than that of the lightly-doped source/drain regions. At this point, a MOSFET, also-called multi-gate MOSFET, is obtained according to the first embodiment of the present invention. One of the main characteristic of the present invention is that a lightly-doped region is in-situ formed in each of the epitaxial layers 310 and the vertical interface 140a. The lightly-doped region distributed on the vertical interface 140a may function as a lightly-doped source/drain region (LDD). Since the lightly-doped region is formed by thermal diffusion process, it can be uniformly distributed on the entire surface of the vertical interface 140a. In this structure, carrier channels located on the surfaces (two surfaces or three surfaces) of the fin semiconductor layer 112 may substantially have the same carrier channel length ($L_{eff}$) so that the performance of the corresponding MOSFET may be improved. This characteristic is depicted in FIGS. 7 and 8 and is described in the following paragraphs. Additionally, epitaxial growth process may include at least two sub-epitaxial growth processes according to another embodiment of the present invention. For example, as shown in FIG. 6 accompanied with FIG. 3, an in-situ sub-epitaxial growth process is applied to form an L-shape epitaxial layer on the vertical interface 140a and the semiconductor interface 140b. The L-shape epitaxial layer has a vertical portion 300a and a horizontal portion 300b. As a result, a lightly-doped region may be respectively formed on the vertical interface 140a and the semiconductor interface 140b during the in-situ sub-epitaxial growth process.

The lightly-doped region distributed on the entire vertical interface 140a may be used as a lightly-doped source/drain of the MOSFET. In a next step, another sub-epitaxial growth process may be carried out to form an epitaxial layer (not shown) on the L-shape epitaxial layer. In other words, the in-situ sub-epitaxial growth process may be only applied at the beginning stage of rather than the entire epitaxial growth process.

Figure 4:
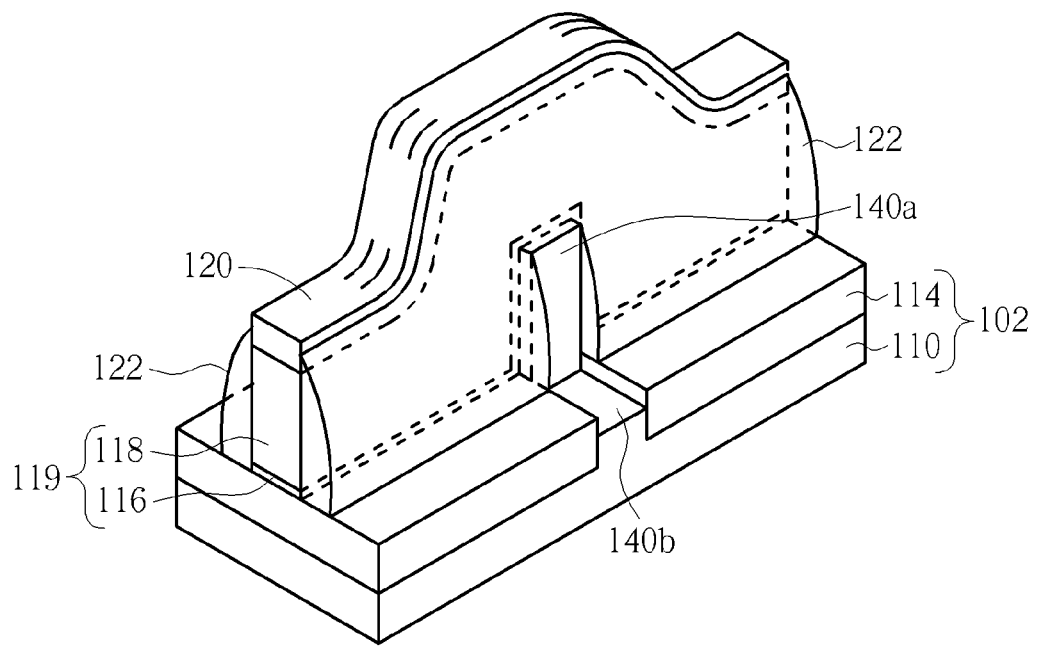

Please refer to FIG. 7. FIG. 7 is a schematic diagram taken along a line AA' in FIG. 5. As shown in FIG. 7 accompanied with FIG. 5, two epitaxial portions 310 include the doped region 312 respectively on each side of the body portion 142, wherein the body portion 310 is the fin semiconductor layer 112 covered by the gate electrode 118 as shown in FIG. 4. The epitaxial portions 310 described herein are substantially the same as the epitaxial layers 310 described in each of the above-mentioned embodiment. As shown in FIG. 7, a vertical interface 140a is interposed between each of the epitaxial portions 310 and the body portion 142 and a lightly-doped region 146a is distributed on the entire surface of the vertical interface 140a. The vertical interface 140a is preferably close to the sidewalls of the gate structure 119 as much as possible. Most preferably, the vertical interface 140a is preferably aligned with the sidewalls of the gate structure 119. Additionally, a semiconductor interface 140b is interposed between each of the epitaxial portions 310 and the semiconductor substrate 220, where a lightly-doped region 146b is distributed on each semiconductor interface 140b. As described in the above paragraph, since the lightly-doped regions 146a and 146b are formed concurrently during the epitaxial growth process, they may be respectively and uniformly distributed on the vertical interface 140a and the semiconductor interface 140b. Additionally, at least one component of the epitaxial portion 310 is the same as the component in the lightly-doped region 146a and 146b. Furthermore, since the carrier channel is located on the surface of the body portion 142 and between the two vertical interfaces 140a, the lightly-doped region 146a uniformly distributed on the entire vertical interface 140a may be used as a lightly-doped source/drain and the carrier channels on different surfaces of the body portion 142 may substantially have the same channel length L. In this way, the channel length variation is therefore reduced and performance of the corresponding MOSFET is improved.

Please refer to FIG. 8. FIG. 8 is a schematic diagram taken along a line BB' in FIG. 5. As shown in FIG. 8 accompanied with FIG. 5, a semiconductor interface 140b is interposed between each of the epitaxial portions 310 and the semiconductor substrate 220, where a lightly-doped region 146b is distributed on each semiconductor interface 140b. It should be noted that the epitaxial portions 310 described herein are substantially the same as the epitaxial layers 310 described in each of the above-mentioned embodiments. Furthermore, a portion of each epitaxial portion 310 may be indirect contact with the corresponding first spacer 122. To put it more concretely, two opposite surfaces 150a and 150b are directly in contact with a portion of each first epitaxial portion 310 so that an embedded structure can be obtained. According to each of the above-mentioned embodiments, the lightly-doped region interposed between the epitaxial portion and the semiconductor substrate approximately aligns with the isolation layer. According to another embodiment, however, if a portion of the fin semiconductor layer extruding from the isolation layer still remains outside of the first pacer before the epitaxial layers are formed, or if the semiconductor substrate below the fin semiconductor layer is over etched away, the position of the lightly-doped regions may be slightly higher or lower than a top surface of the isolation.

Figure 9:
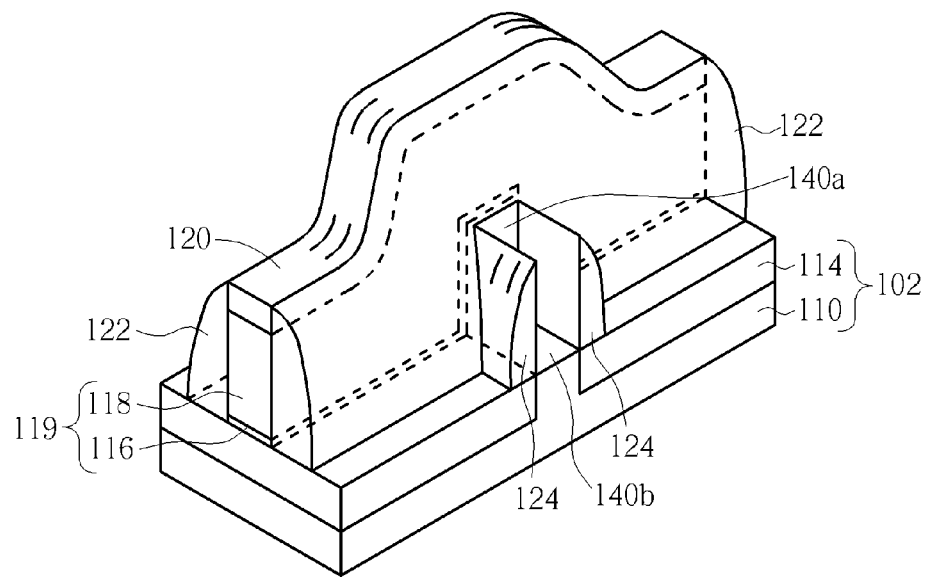

In the above paragraphs, the first embodiment of the present invention is disclosed, but the present invention is not limited thereto. According to a second embodiment of the present invention, the fin semiconductor layer outside of the first spacer may be removed at a different time. As shown in FIG. 9 accompanied with FIG. 1, the structure illustrated in this embodiment is similar to the structure shown in FIG. 1. After the semiconductor structure 100 shown in FIG. 1 is provided, the second spacer 124 is not removed temporally. That is to say, according to the second embodiment, the fin semiconductor layer 112 outside of the first spacer 122 may be removed first by means of an etch process, such as a dry etch process, by using the first mask 120, the first spacer 122 and the second spacer 124 as etching masks. In this way, a vertical interface 140a is formed on at least a side of the fin semiconductor layer 112. Preferably, the vertical interface 140a is a vertical plane parallel to an extending direction of the gate electrode 118 so that the vertical plane may be aligned with the edge of a portion of the first spacer 122. Additionally, since the fin semiconductor layer 112 outside of the first spacer 122 is removed completely during the above-mentioned etch process, a semiconductor interface 140b on the semiconductor substrate 110 may be exposed. Preferably, there is a right angle between the vertical interface 140a and the semiconductor interface 140b, but not limited thereto. In a next step, the second spacer 124 may be removed optionally, so that the structure shown in FIG. 3 can be obtained. After this, the epitaxial layers and the lightly-doped regions may be formed through an in-situ epitaxial growth process. Since the subsequently processes according to the present invention is substantially the same as that described in the first embodiment, the detailed description of these processes is therefore omitted for the sake of clarity.

At this point, a multi-gate MOSFET with fin structure is fabricated via the gate-first or the gate-last process described above. It is worth noting that, in above embodiments, three contact faces between the body portion 142 of the fin structure and the gate dielectric layer 116 function as a carrier channel whose width is wider than a channel width in conventional planar MOSFET. When a driving voltage is applied, the multi-gate MOSFET produces a double on-current comparing to the conventional planar MOSFET. The above-mentioned multi-gate MOSFET, however, is not limited to a tri-gate MOSFET. According to different requirements, a patterned hard mask (not shown) may exist between the top surface of the body portion 142 and the gate dielectric layer 116, therefore, only two contact faces would be between the body portion 142 and the gate dielectric layer 116. A MOSFET with such two contact faces is called fin metal oxide semiconductor field effect transistor (Fin FET)

According to each of the embodiments described above, only a MOSFET with a single conductivity type (that is, either PMOS or NMOS) is provided. However, the present invention may adopt other suitable devices, such as complementary MOSFET, as applicable subject matters. The structure of this complementary MOSFET is described in detail in the following paragraphs. It should be noted that only the main differences between the present embodiment and the previous embodiment are described and the same reference signs are generally used to refer to corresponding or similar features in modified and different embodiments.

Figure 10:
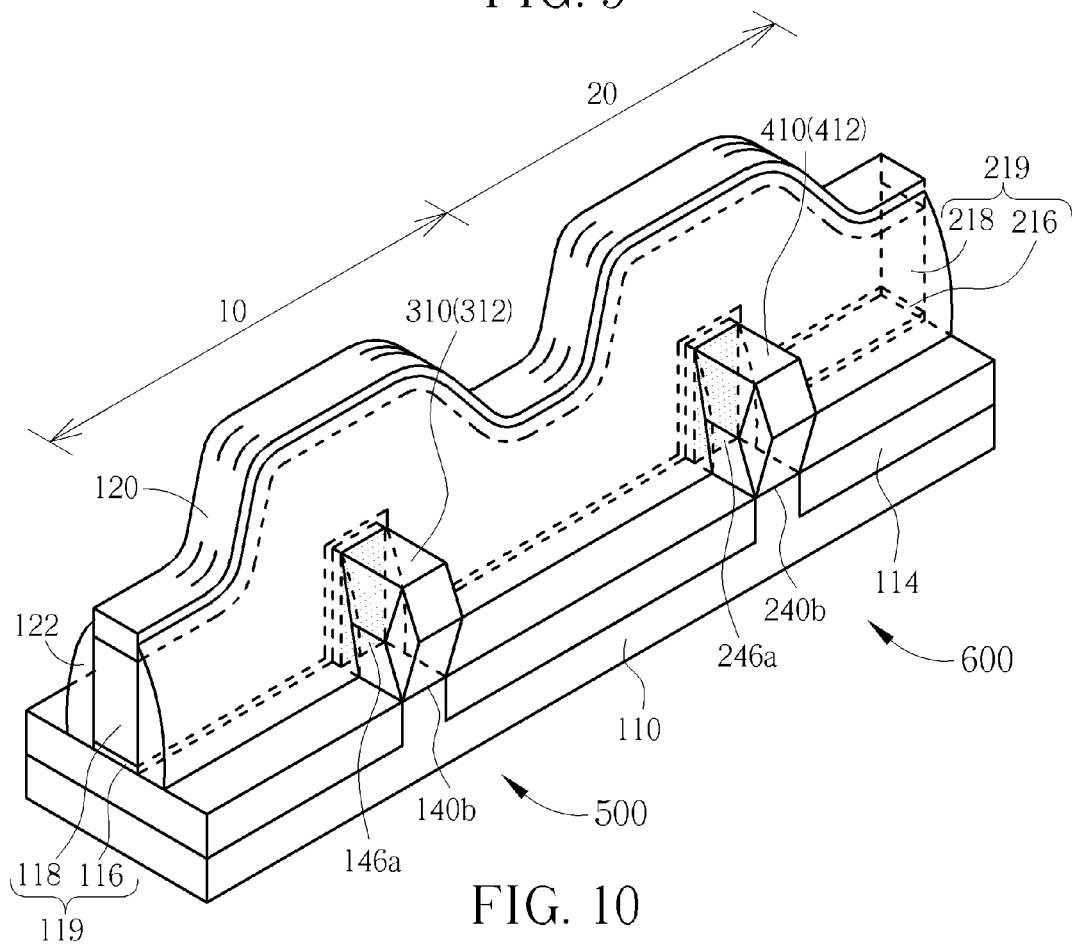

As shown in FIG. 10 accompanied with FIG. 5, a complementary MOSFET 700 is provided according to this embodiment. A substrate 102 includes a first MOSFET region 10, such as an NMOS region, and a second MOSFET region 20, such as a PMOS region. A first MOSFET 500, such as an NMOS, is disposed within the first MOSFET region 10 and includes a first fin structure, two first lightly-doped regions 146a, two first doped regions 312 and a first gate structure 119. A first fin structure includes a first body portion 142 and two first epitaxial portions 310, wherein each of the first epitaxial portions 310 is respectively disposed on each side of the first body portion 142, and a first vertical interface 140a is interposed between the first body portion 142 and each of the first epitaxial portions 310. Each first lightly-doped region is respectively and uniformly formed on each of the entire first vertical interface 140a. Each first doped region 312 is respectively disposed in each of the first epitaxial portions 310. The first gate structure 119 overlays the first body portion 142. Furthermore, the second MOSFET 600 is disposed within the second MOSFET region 20. The structure of the second MOSFET 600 is approximately the same as that of the first MOSFET 500, however, the composition of the epitaxial portions and the conductivity type of the lightly-doped region between these two embodiments may be different. By the way of example, if the second MOSFET 600 is a PMOS, the epitaxial portion 410 may be made of material, such as silicon germanium, which is able to apply a compressive stress to a carrier channel and the second lightly-doped region preferably includes P-type dopants, such as boron. To put it more concretely, the second MOSFET 600 includes a second fin structure, two second lightly-doped regions, two second doped regions 412 and a second gate structure 219. The second fin structure includes a second body portion (not shown) and two epitaxial portions 410. Each of the second epitaxial portions 410 may be respectively disposed on each side of the second body portion and each second lightly-doped region may be distributed on the entire surface of each of the second vertical interfaces 240a. Each second doped region 412 is disposed in each of the second epitaxial portions 410. The second gate structure 219 including a second gate dielectric layer 216 and a second gate electrode 218 overlays the second body portion.

To summarize, the present invention provide complementary MOSFET structures, MOSFET structures and the manufacturing method thereof. A vertical interface is located between an epitaxial portion and a body portion of a fin semiconductor layer. A lightly-doped region can be formed and distributed uniformly on the vertical interface during an epitaxial growth process. The lightly-doped region may function as a lightly-doped source/drain in the corresponding MOSFET. As a result, carrier channels near the surface of the fin semiconductor layer may substantially have the same channel length ($L_{eff}$). Furthermore, the concentration of the lightly-doped source/drain may be raised up by adjusting the parameter of the epitaxial growth process, so it can also improve the performance of the corresponding MOSFET.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A complementary metal oxide semiconductor field-effect transistor (MOSFET) comprising:
    a substrate comprising a first transistor region and a second transistor region;

a first MOSFET disposed in the first transistor region, wherein the first MOSFET comprises:
   a first fin structure comprising a first body portion and two first epitaxial portions, wherein the first epitaxial portions are respectively disposed on each side of the first body portion, and a first vertical interface is interposed between the first body portion and each of the first epitaxial portions;
   a first gate structure overlying the first body portion, wherein the first epitaxial portions are at sides of the first gate structure;
   two first lightly-doped regions respectively and uniformly formed on each of the entire first vertical interface, wherein each of the first lightly-doped regions is disposed between the first body portion and each of the epitaxial portions and further disposed on an interface between each of the first epitaxial portions and the semiconductor substrate, the first lightly-doped regions separately disposed on two opposite sides of the first body portion;
   two first doped regions respectively disposed in each of the first epitaxial portions, wherein the first doped regions are source/drain regions; and
a second MOSFET disposed in the second transistor region.

2. The complementary MOSFET of claim 1, wherein the body portion comprises a first material, and the epitaxial portions comprises a second material being different from the first material.

3. The complementary MOSFET of claim 1, wherein the first vertical interface is a vertical plane.

4. The complementary MOSFET of claim 1, wherein the gate structure further comprises a gate spacer disposed on sidewalls of the first gate structure.

5. The complementary MOSFET of claim 4, wherein the gate spacer comprises two opposite surfaces directly in contact with a portion of at least one of the first epitaxial portions.

6. The complementary MOSFET of claim 1, wherein the substrate comprises a semiconductor substrate and an isolation layer disposed on the semiconductor substrate.

7. The complementary MOSFET of claim 6, wherein a portion of the semiconductor substrate extrudes through the isolation layer.

8. The complementary MOSFET of claim 1, wherein the first epitaxial portions comprise epitaxial silicon, epitaxial silicon germanium, epitaxial silicon germanium doped with boron, epitaxial silicon phosphorus, or epitaxial silicon carbon.

9. A complementary MOSFET of claim 1, wherein the second MOSFET further comprises:
   a second fin structure, comprising:
      a second body portion; and
      two second epitaxial portions respectively disposed on each side of the second body portion, and a second vertical interface is interposed between the second body portion and each of the second epitaxial portions;
   two second lightly-doped regions respectively and uniformly formed on each of the entire second vertical interface;
   two second doped regions respectively disposed in each of the second epitaxial portions; and
   a second gate structure overlying the second body portion.

10. A metal oxide semiconductor field-effect transistor (MOSFET) comprising:
   a substrate;
   a fin structure disposed on the substrate, wherein the fin structure comprises a body portion, two epitaxial portions, and a vertical interface is interposed between the body portion and each of the epitaxial portions;
   a gate structure overlying the body portion of the fin structure, wherein the epitaxial portions are at sides of the gate structure;
   two lightly-doped regions respectively and uniformly formed on the entire vertical interface, wherein each of the lightly-doped regions is disposed between the body portion and each of the epitaxial portions and further disposed on an interface between each of the epitaxial portions and the semiconductor substrate, the lightly-doped regions separately disposed on two opposite sides of the body portion; and
   two doped regions respectively disposed in each of the epitaxial portions, wherein the doped regions are source/drain regions.

11. The MOSFET of claim 10, wherein each of the vertical interfaces is a vertical plane.

12. The MOSFET of claim 10, further comprising a gate spacer disposed on sidewalls of the gate structure.

13. The MOSFET of claim 12, wherein the gate spacer comprises two opposite surfaces directly in contact with a portion of at least one of the epitaxial portions.

14. The MOSFET of claim 10, wherein the substrate comprises a semiconductor substrate and an isolation layer disposed on the semiconductor substrate.

15. The complementary MOSFET of claim 1, further comprising two L-shape epitaxial layers respectively interposed between the first body portion and the first epitaxial portions.

16. The complementary MOSFET of claim 10, further comprising two L-shape epitaxial layers respectively interposed between the body portion and the epitaxial portions.

* * * * *